(12) United States Patent
Minemura et al.

(10) Patent No.: US 9,224,469 B2
(45) Date of Patent: Dec. 29, 2015

(54) SEMICONDUCTOR MEMORY DEVICE AND MEMORY SYSTEM

(71) Applicant: KABUSHIKI KAISHA TOSHIBA, Minato-ku (JP)

(72) Inventors: Yoichi Minemura, Yokkaichi (JP); Takayuki Tsukamoto, Yokkaichi (JP); Hiroshi Kanno, Yokkaichi (JP); Takamasa Okawa, Yokkaichi (JP); Atsushi Yoshida, Yokkaichi (JP); Hideyuki Tabata, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/305,503

(22) Filed: Jun. 16, 2014

(65) Prior Publication Data

US 2015/0117089 A1 Apr. 30, 2015

Related U.S. Application Data

(60) Provisional application No. 61/897,260, filed on Oct. 30, 2013.

(51) Int. Cl.
*G11C 11/00* (2006.01)
*G11C 13/00* (2006.01)

(52) U.S. Cl.
CPC ........ *G11C 13/0069* (2013.01); *G11C 13/0064* (2013.01); *G11C 2013/0054* (2013.01); *G11C 2013/0076* (2013.01); *G11C 2213/71* (2013.01);
(Continued)

(58) Field of Classification Search
CPC . G11C 13/0002; G11C 13/0004; G11C 11/14

USPC .......................... 365/148, 163, 158, 171, 173
See application file for complete search history.

(56) References Cited

U.S. PATENT DOCUMENTS 8,085,576 B2    12/2011    Hosono et al.
8,345,466 B2    1/2013    Maejima et al.
(Continued)

FOREIGN PATENT DOCUMENTS

JP    2010-198687    9/2010
JP    2011-54259    3/2011
(Continued)

OTHER PUBLICATIONS

U.S. Appl. No. 14/023,611, filed Sep. 11, 2013, Yoichi Minemura, et al.

*Primary Examiner* — Han Yang
(74) *Attorney, Agent, or Firm* — Oblon, McClelland, Maier & Neustadt, L.L.P.

(57) ABSTRACT

A semiconductor memory device according to an embodiment includes a memory cell array and a control circuit. The memory cell array includes first lines and second lines intersecting each other, a third line commonly connecting to the first lines, memory cells disposed at intersections of the first lines and the second lines, respectively. The control circuit is configured to execute a state determining operation detecting a voltage of the third line, and adjust a voltage applied to the first lines and the second lines during a resetting operation or a setting operation based on a result of the state determining operation. The resetting operation raises a resistance value of the variable resistance element. The setting operation lowers the resistance value of the variable resistance element.

16 Claims, 11 Drawing Sheets

(52) U.S. Cl.
CPC ........ *G11C 2213/77* (2013.01); *G11C 2213/78* (2013.01); *G11C 2213/79* (2013.01)

(56) References Cited

U.S. PATENT DOCUMENTS

| | | |
|---|---|---|
| 8,493,770 B2 | 7/2013 | Hosono et al. |
| 2010/0259960 A1 | 10/2010 | Samachisa |
| 2012/0033512 A1 | 2/2012 | Takase |
| 2012/0182784 A1 | 7/2012 | Murooka |
| 2012/0212474 A1* | 8/2012 | Hwang et al. ................. 345/212 |
| 2013/0250657 A1* | 9/2013 | Haukness et al. ............. 365/148 |

FOREIGN PATENT DOCUMENTS

| | | |
|---|---|---|
| JP | 2011-86365 | 4/2011 |
| JP | 2012-38371 | 2/2012 |
| JP | 2012-146380 | 8/2012 |
| JP | 2012-523647 | 10/2012 |

\* cited by examiner

SEMICONDUCTOR MEMORY DEVICE AND MEMORY SYSTEM

CROSS REFERENCE TO RELATED APPLICATION

This application is based upon and claims the benefit of priority from Provisional Application No. 61/897,260, filed on Oct. 30, 2013, the entire contents of which are incorporated herein by reference.

BACKGROUND

1. Field

Embodiments described in the present specification relate to a semiconductor memory device and a memory system.

2. Description of the Related Art

In recent years, an LSI element included in a semiconductor memory device has become increasingly shrunk as a level of integration of the semiconductor memory device has risen. Shrinking of this LSI element requires not only simply that line width be narrowed, but also requires improvement of dimensional accuracy or positional accuracy of a circuit pattern. Proposed as a technology for overcoming such a problem is ReRAM (Resistive RAM) having a variable resistance element that has reversibly changeable resistance value. Moreover, in this ReRAM, a structure where the variable resistance element is provided between a side surface of a word line extending parallel to a substrate and a side surface of a bit line extending perpendicularly to the substrate has made possible an even higher degree of integration of a memory cell array.

However, characteristics of the variable resistance element sometimes change according to the number of times that its resistance value has been changed (the number of times of executions of a write/erase operation).

DETAILED DESCRIPTION

A semiconductor memory device according to an embodiment comprises a memory cell array and a control circuit. The memory cell array includes first lines and second lines intersecting each other, a third line commonly connecting to the first lines are, memory cells disposed at intersections of the first lines and the second lines, respectively, each of the memory cells including a variable resistance element, and selection elements disposed between the first lines and the third line. The control circuit is configured to execute a state determining operation detecting a voltage of the third line, and adjust a voltage applied to the first lines and the second lines during a resetting operation or a setting operation based on a result of the state determining operation. The resetting operation raises a resistance value of the variable resistance element. The setting operation lowers the resistance value of the variable resistance element.

First Embodiment

Configuration

Figure 1:
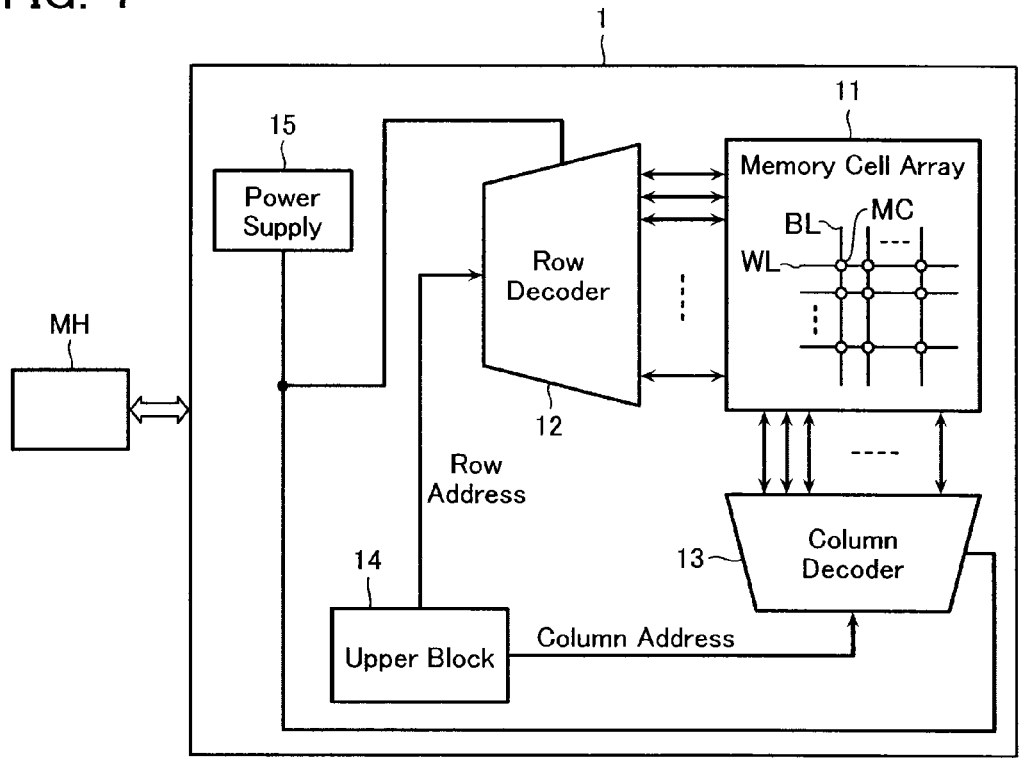
FIG. 1 is an example of a block diagram of a semiconductor memory device according to an embodiment.

First, an overall configuration of a semiconductor memory device according to an embodiment will be described. FIG. 1 is a block diagram of the semiconductor memory device according to the embodiment. As shown in FIG. 1, a semiconductor memory device 1 according to the embodiment includes a memory cell array 11, a row decoder 12, a column decoder 13, an upper block 14, and a power supply 15.

The memory cell array 11 includes a plurality of word lines WL and bit lines BL that intersect each other, and a memory cell MC disposed at each of intersections of these word lines WL and bit lines BL. The row decoder 12 selects the word line WL during access (data erase/write/read). The column decoder 13 selects the bit line BL during access and includes a driver that controls an access operation.

The upper block 14 selects the memory cell MC which is to be an access target in the memory cell array 11. The upper block 14 provides the row decoder 12 and the column decoder 13 with a row address and a column address, respectively. The power supply 15 generates a combination of certain voltages corresponding to each of operations of data erase/write/read, and supplies the combination of certain voltages to the row decoder 12 and the column decoder 13.

The semiconductor memory device 1 can be combined with a host or memory controller MH to configure a memory system. The host or memory controller MH sends a command, data to be stored, and so on, to the semiconductor memory device 1. In response to the command sent from the host or memory controller MH, the semiconductor memory device 1 stores data or reads stored data to be sent to the host or memory controller MH.

Figure 2:
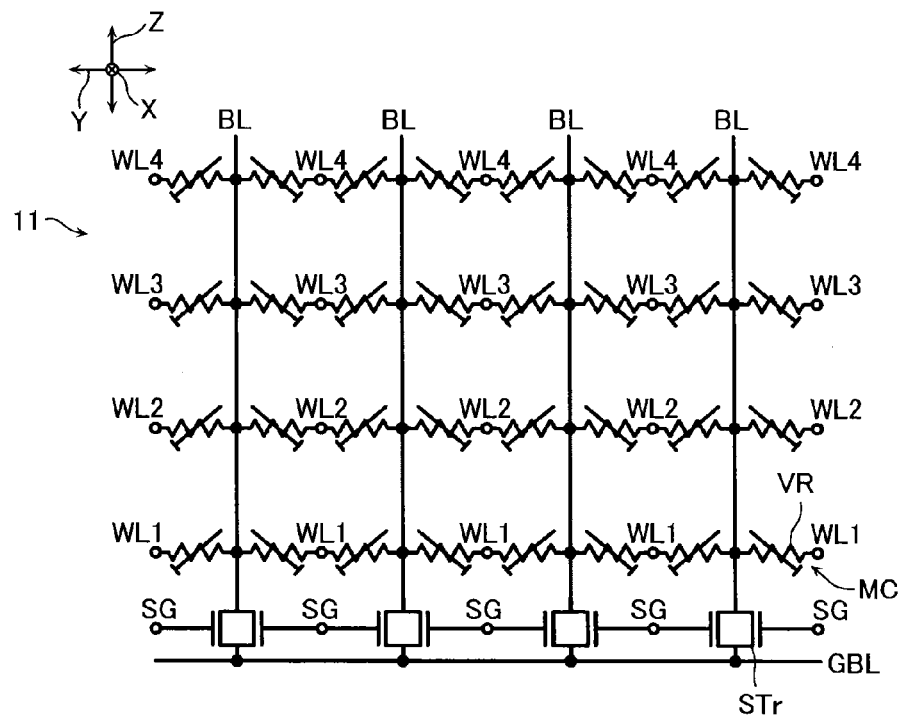
FIG. 2 is an example of a circuit diagram of a memory cell array 11 according to the embodiment.

Next, the memory cell array 11 according to the embodiment will be described in detail with reference to FIG. 2. FIG. 2 is a circuit diagram of the memory cell array 11. Note that in FIG. 2, an X direction, a Y direction, and a Z direction are orthogonal to each other, and the X direction is a direction perpendicular to a plane of paper. Moreover, a structure shown in FIG. 2 is provided repeatedly in the X direction.

As shown in FIG. 2, the memory cell array 11 includes a select transistor STr, a global bit line GBL, and a select gate line SG, in addition to the above-mentioned word line WL, bit line BL, and memory cell MC.

As shown in FIG. 2, word lines WL1 to WL4 are arranged in the Z direction and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions.

As shown in FIG. 2, the memory cell MC includes a variable resistance element VR. The variable resistance element VR is electrically rewritable and stores data in a nonvolatile manner based on a resistance value. The variable resistance element VR attains a low-resistance state (set state) by a setting operation that applies a certain voltage or more to both ends of the variable resistance element VR, and attains a high-resistance state (reset state) by a resetting operation that applies a certain voltage or more to both ends of the variable resistance element VR. Moreover, immediately after manufacturing, the variable resistance element VR is in a high-resistance state and does not easily have its resistance state changed. Accordingly, the variable resistance element VR undergoes a forming operation in which a high voltage greater than or equal to those of the setting operation and resetting operation is applied to both ends of the variable resistance element VR. As a result of this forming operation, a region (filament path) where locally current flows easily is formed in the variable resistance element VR, and the variable resistance element VR can easily have its resistance state changed, thereby attaining a state of being operable as a storage element.

As shown in FIG. 2, the select transistor STr is provided between the global bit line GBL and one end of the bit line BL. The global bit lines GBL are aligned in the X direction and extend in the Y direction. One global bit line GBL is commonly connected to one ends of a plurality of the select transistors STr arranged in a line in the Y direction. The select gate lines SG are aligned in the Y direction and extend in the X direction. One select gate line SG is commonly connected to gates of a plurality of the select transistor STr arranged in a line in the X direction.

Figure 3:
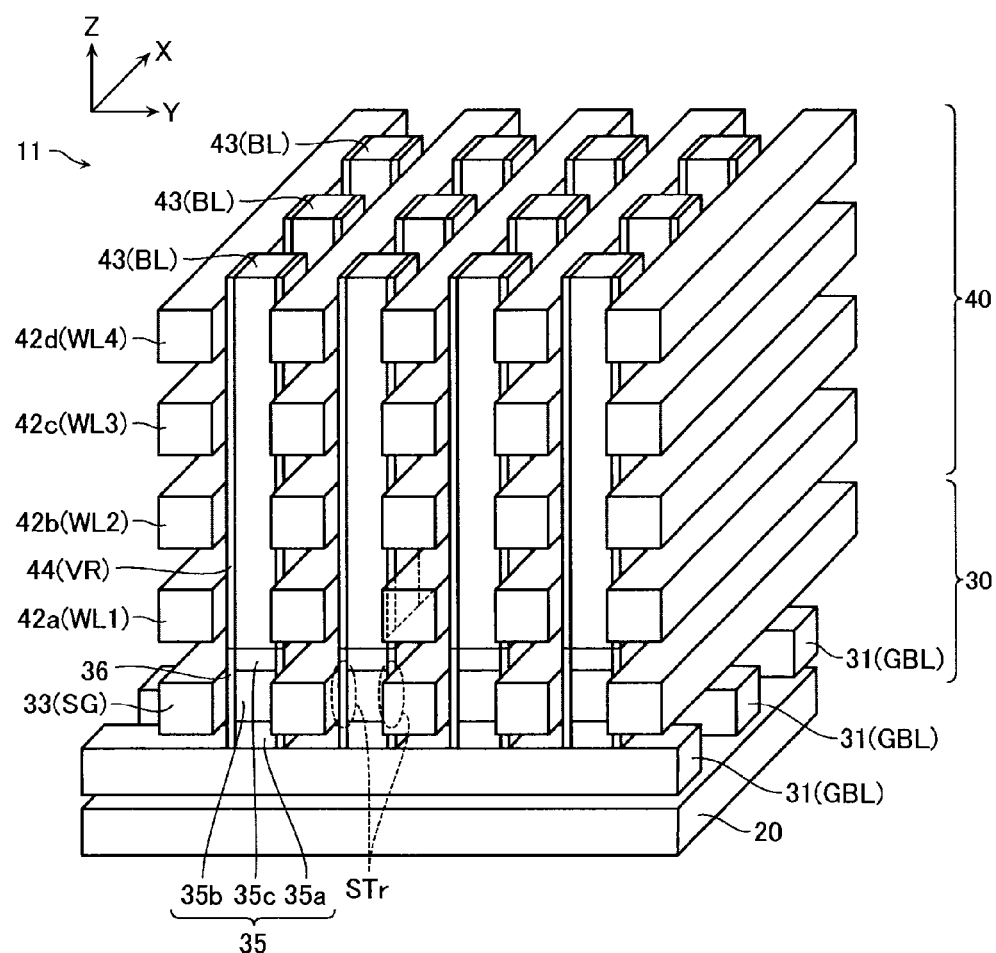
FIG. 3 is an example of a perspective view showing a stacked structure of the memory cell array 11 according to the embodiment.
Figure 4:
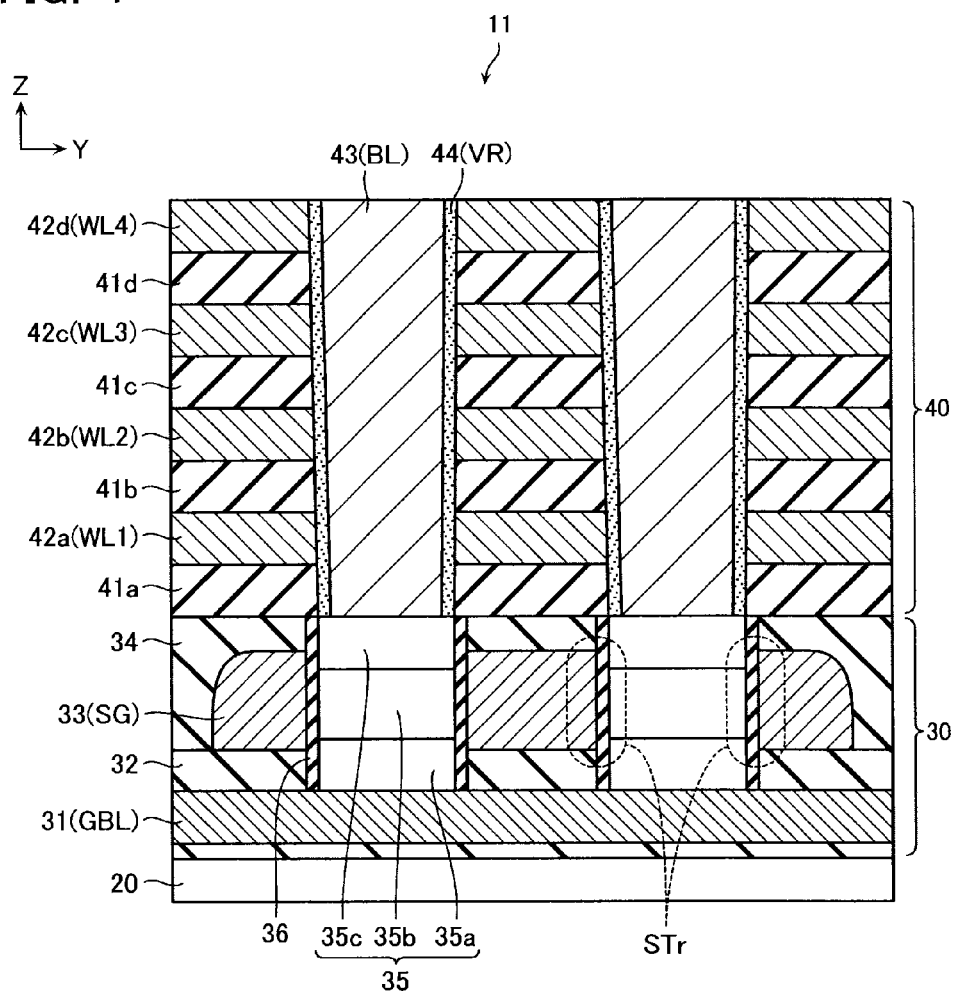
FIG. 4 is an example of a cross-sectional view of FIG. 3.
Figure 5:
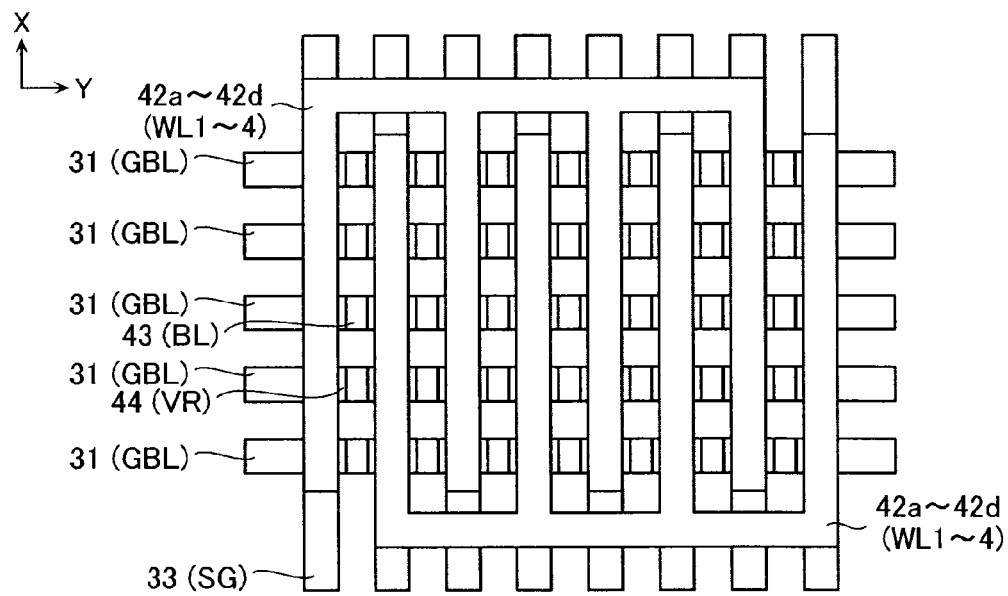
FIG. 5 is an example of a top view of FIG. 3.

Next, a stacked structure of the memory cell array 11 according to the embodiment will be described with reference to FIGS. 3 to 5. FIG. 3 is a perspective view showing the stacked structure of the memory cell array 11. FIG. 4 is a cross-sectional view of FIG. 3, and FIG. 5 is a top view of FIG. 3. Note that in FIGS. 3 and 5, an interlayer insulating layer is omitted.

As shown in FIGS. 3 and 4, the memory cell array 11 includes a select transistor layer 30 and a memory layer 40 that are stacked on a substrate 20. The select transistor layer 30 functions as the select transistor STr, and the memory layer 40 functions as the memory cell MC.

As shown in FIGS. 3 and 4, the select transistor layer 30 includes a conductive layer 31, an interlayer insulating layer 32, a conductive layer 33, and an interlayer insulating layer 34 that are stacked in the Z direction perpendicular to the substrate 20. The conductive layer 31 functions as the global bit line GBL, and the conductive layer 33 functions as the select gate line SG and as the gate of the select transistor STr.

The conductive layers 31 are aligned with a certain pitch in the X direction parallel to the substrate 20, and extend in the Y direction (refer to FIG. 5). The interlayer insulating layer 32 covers an upper surface of the conductive layer 31. The conductive layers 33 are aligned with a certain pitch in the Y direction and extend in the X direction (refer to FIG. 5). The interlayer insulating layer 34 covers a side surface and an upper surface of the conductive layer 33. The conductive layers 31 and 33 are configured by, for example, polysilicon. The interlayer insulating layers 32 and 34 are configured by, for example, silicon oxide ($SiO_2$).

In addition, as shown in FIGS. 3 and 4, the select transistor layer 30 includes a semiconductor layer 35 and a gate insulating layer 36. The semiconductor layer 35 functions as a body (channel) of the select transistor STr, and the gate insulating layer 36 functions as a gate insulating film of the select transistor STr. Note that the semiconductor layer 35 can be configured in a column shape.

The semiconductor layers 35 are disposed in a matrix in the X and Y directions, and extend in a column shape in the Z direction. Moreover, the semiconductor layer 35 contacts the upper surface of the conductive layer 31, and contacts a side surface at an end in the Y direction of the conductive layer 33 via the gate insulating layer 36. Furthermore, the semiconductor layer 35 includes an N+ type semiconductor layer 35a, a P+ type semiconductor layer 35b, and an N+ type semiconductor layer 35c that are stacked.

As shown in FIGS. 3 and 4, the N+ type semiconductor layer 35a contacts the interlayer insulating layer 32 at a side surface at an end in the Y direction of the N+ type semiconductor layer 35a. The P+ type semiconductor layer 35b contacts a side surface of the conductive layer 33 at a side surface at an end in the Y direction of the P+ type semiconductor layer 35b. The N+ type semiconductor layer 35c contacts the interlayer insulating layer 34 at a side surface at an end in the Y direction of the N+ type semiconductor layer 35c. The N+ type semiconductor layers 35a and 35c are configured by polysilicon implanted with an N+ type impurity, and the P+ type semiconductor layer 35b is configured by polysilicon implanted with a P+ type impurity. The gate insulating layer 36 is configured by, for example, silicon oxide ($SiO_2$).

As shown in FIGS. 3 and 4, the memory layer 40 includes interlayer insulating layers 41a to 41d and conductive layers 42a to 42d, stacked alternately in the Z direction. The conductive layers 42a to 42d function as the word lines WL1 to WL4.

As shown in FIG. 5, the conductive layers 42a to 42d include a pair of comb tooth shapes that face each other in the X direction. The interlayer insulating layers 41a to 41d are configured by, for example, silicon oxide ($SiO_2$), and the conductive layers 42a to 42d are configured by, for example, polysilicon.

Moreover, as shown in FIGS. 3 and 4, the memory layer 40 includes a column-shaped conductive layer 43 and a variable resistance layer 44. The conductive layers 43 are disposed in a matrix in the X and Y directions, contact an upper surface of the semiconductor layer 35, and extend in a column shape in the Z direction. The conductive layer 43 functions as the bit line BL.

The variable resistance layer 44 is provided on a side surface at an end in the Y direction of the conductive layer 43. The variable resistance layer 44 functions as the variable resistance element VR.

The conductive layer 43 is configured by, for example, polysilicon, and the variable resistance layer 44 is configured by, for example, a metal oxide. More specifically, the variable resistance layer 44 has a main component of an oxide that includes at least one element selected from the group consisting of Hf, Zr, Ni, Ta, W, Co, Al, Fe, Mn, Cr, and Nb. The variable resistance layer 44 is configured by one of materials such as $HfO_2$, $Al_2O_3$, $TiO_2$, NiO, WO, $Ta_2O_5$, and so on.

In addition, the following may be employed in the variable resistance layer 44, namely, Si in a polycrystalline or amorphous state, or Ge, SiGe, GaAs, InP, GaP, GaInAsP, GaN, SiC, SiO, SiON, SiN, HfSiO, AlO, and so on. Moreover, a stacked film of the above-mentioned materials may also be employed in the variable resistance layer 44. Furthermore, an electrode of, for example, Ag, Au, Ti, Ni, Co, Al, Fe, Cr, Cu, W, Hf, Ta, Pt, Ru, Zr or Ir, or a nitride or carbide of these elements, and so on, may be disposed as an electrode between the variable resistance layer 44 and the conductive layer 43. Moreover, a material having the above-described materials added to polycrystalline silicon may also be employed as the electrode.

As described above, in the present embodiment, the variable resistance layer 44 (variable resistance element VR) is provided between a side surface of the conductive layers 42a to 42d (word lines WL) extending parallel to the substrate 20 and a side surface of the conductive layer 43 (bit line BL) extending perpendicularly to the substrate 20. Hence, in the present embodiment, the memory cell array 11 can be highly integrated.

[Operations]

Next, operations in the semiconductor memory device of the present embodiment will be described. Note that in the operations of the present embodiment described below, prior to execution of the setting operation or the resetting operation, the number of variable resistance elements VR in a low-resistance state in the memory cell array 11 is set substantially equal to the number of variable resistance elements VR in a high-resistance state in the memory cell array 11, by wear leveling or randomizing.

First, a change in characteristics of the variable resistance element VR due to the number of times the resistance value has been changed (cycle number) will be described with reference to FIGS. 6 and 7. Note that in the present embodiment, the cycle number is the number of times of the setting operations or the number of times of the resetting operations. Moreover, the horizontal axis of FIG. 7 is a current flowing in a memory cell when performing read of data on a memory cell in a high-resistance state, and the vertical axis is the number of memory cells. That is, FIG. 7 shows a distribution of current flowing in each of the memory cells in the memory cell array.

Figure 6:
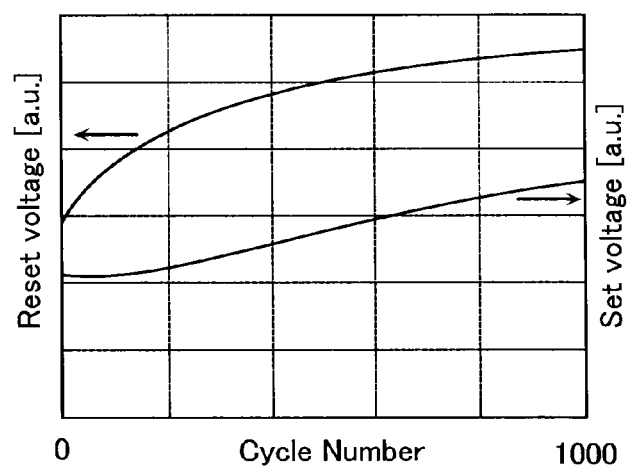
FIG. 6 is an example of a view showing a change in a setting voltage and a resetting voltage accompanying a change in a cycle number.
Figure 7:
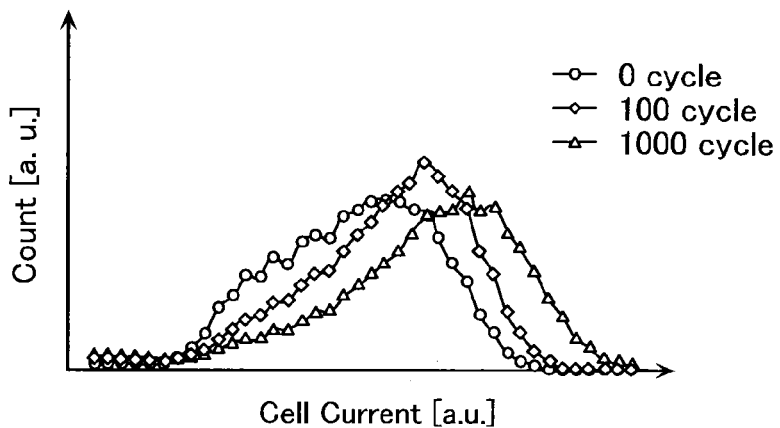
FIG. 7 is an example of a view showing a change in a cell current accompanying a change in a cycle number.

As shown in FIG. 6, as the cycle number increases, a resetting voltage required in the resetting operation and a setting voltage required in the setting operation increase. Moreover, as shown in FIG. 7, as the cycle number increases, characteristics of cell current flowing in the memory cell MC (variable resistance element VR) change. In this way, characteristics of the variable resistance element VR may change according to the cycle number. Therefore, if a constant setting voltage or resetting voltage is always applied to the variable resistance element VR regardless of the cycle number, a probability that the resistance value of the variable resistance element VR does not change increases.

Figure 8:
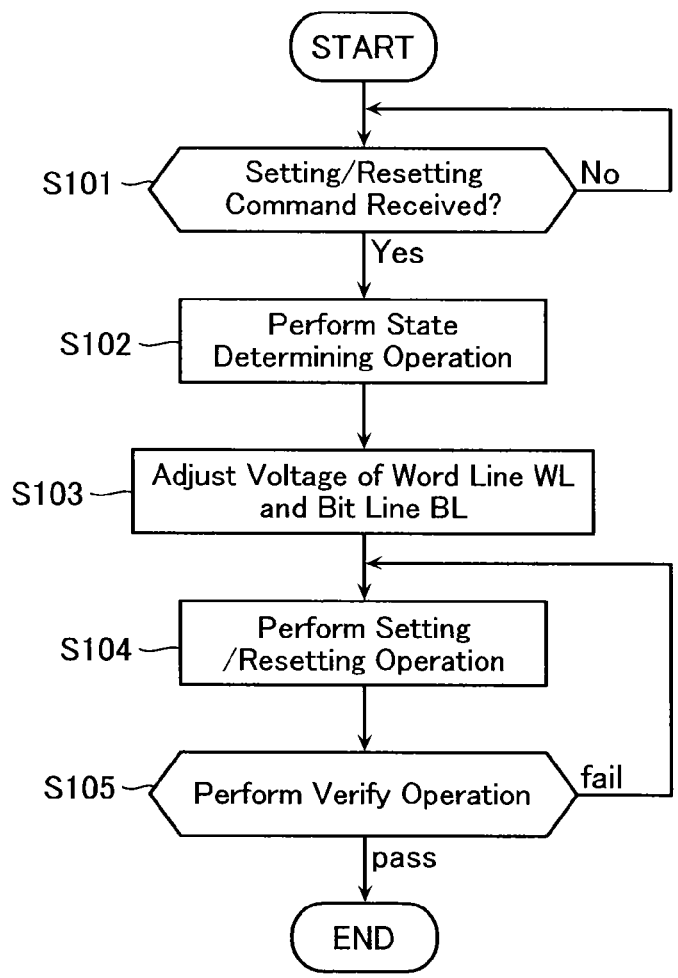
FIG. 8 is an example of a flowchart showing a setting or resetting operation according to a first embodiment.

So, the present embodiment executes control shown in FIG. 8. As shown in FIG. 8, the sequence is executed by, for example, the row decoder 12, the column decoder 13, the upper block 14, and the power supply 15. Note that the row decoder 12, the column decoder 13, the upper block 14, and the power supply 15 are sometimes collectively referred to as a control circuit.

As shown in FIG. 8, first, the control circuit determines whether the semiconductor memory device has received a setting or resetting command, or not (S101). If it is determined that the setting or resetting command has not been received (S101, No), then the control circuit repeatedly executes step S101. On the other hand, if it is determined that the setting or resetting command has been received (S101, Yes), then the control circuit executes step S102.

In step S102, the control circuit executes a state determining operation in which the control circuit detects a voltage of the global bit line GBL that changes based on a current flowing from the bit line BL via a plurality of the variable resistance elements VR into the word line WL, and thereby determines a state of the variable resistance elements VR. Following this, the control circuit adjusts a voltage applied to the word line WL and the bit line BL based on a voltage of the bit line BL detected by the state determining operation (S103). Next, the control circuit executes the setting operation or the resetting operation by the adjusted voltage (S104). Then, the control circuit executes a verify operation (S105). The verify operation determines whether the memory cell MC (variable resistance element VR) is in the set state or the reset state, or not. If fail is determined in the verify operation (S105, fail), then the control circuit re-executes step S104. If pass is determined in the verify operation (S105, pass), then the control circuit finishes the operation. Note that when step S104 is re-executed, the control circuit can change a value of the setting voltage or the resetting voltage, or a width of the setting voltage or the resetting voltage.

Figure 9:
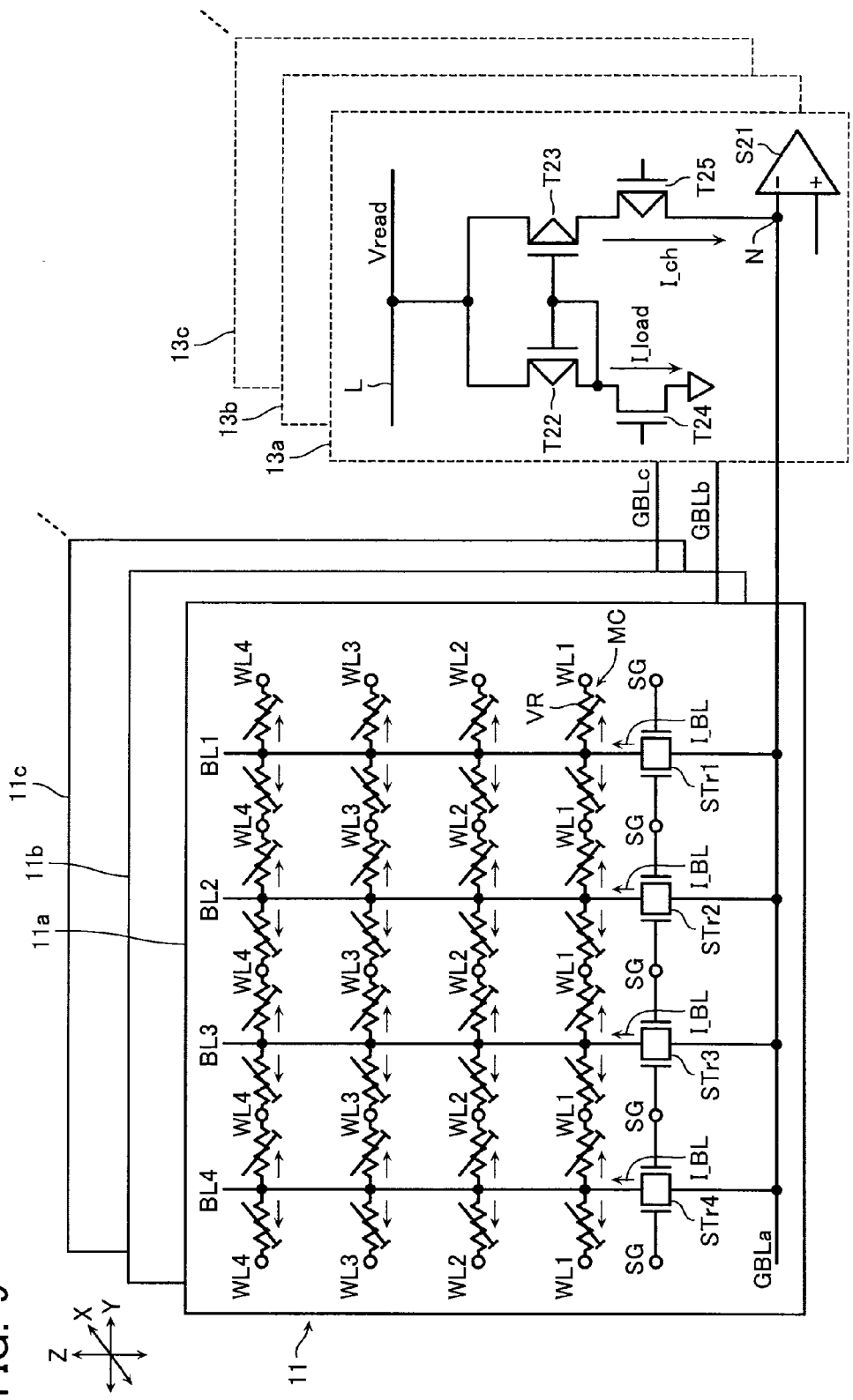
FIG. 9 is an example of a view showing selected-bit-line voltage supply circuits 13a to 13c according to the first embodiment.

In order to execute the control shown in FIG. 8, the column decoder 13 has a configuration shown in FIG. 9. FIG. 9 is a circuit diagram showing a configuration of a selected-bit-line voltage supply circuit 13a included in the column decoder 13. The selected-bit-line voltage supply circuit 13a is connected to a global bit line GBLa connected to a memory cell MC group 11a which is part of the memory cell array 11. The column decoder 13 includes selected-bit-line voltage supply circuits 13b, 13c, . . . that have a similar configuration to the selected-bit-line voltage supply circuit 13a. The selected-bit-line voltage supply circuits 13b, 13c, . . . are respectively connected to global bit lines GBLb, GBLc, . . . that are connected to memory cell groups 11b, 11c, . . . which are part of the memory cell array 11.

As shown in FIG. 9, the selected-bit-line voltage supply circuit 13a is connected to a line L and supplied with a voltage. The selected-bit-line voltage supply circuit 13a includes a sense amplifier S21 and transistors T22 to T25. An inverting input terminal of the sense amplifier S21 is connected to bit lines BL1 to BL4 via the global bit line GBLa and select transistors STr1 to STr4. Note that a select transistor included in the row decoder 12 is connected also to one end of the word lines WL1 to WL4, but this select transistor is not illustrated in FIG. 9.

The PMOS transistors T22 and T23 are current-mirror connected. Gates of the PMOS transistors T22 and T23 are connected to a drain of the NMOS transistor T24. Sources of the PMOS transistors T22 and T23 are commonly connected to the line L. The NMOS transistor T24 is connected between a drain of the PMOS transistor T22 and a ground terminal. The PMOS transistor T25 is connected between a drain of the PMOS transistor T23 and the inverting input terminal of the sense amplifier S21 (node N).

Next, the state determining operation of the selected-bit-line voltage supply circuit 13a will be described with reference to FIG. 9. In the present embodiment, the selected-bit-line voltage supply circuits 13a, 13b, . . . execute a similar operation, and thereby execute the state determining operation on the memory cells MC of the entire memory cell array 11.

In the operations of the present embodiment, the number of variable resistance elements VR in a low-resistance state in the memory cell array 11 is set substantially equal to the number of variable resistance elements VR in a high-resistance state in the memory cell array 11, by wear leveling or randomizing. Hence, as described below, the selected-bit-line voltage supply circuit 13a can determine a degree of change in characteristics of the variable resistance element VR in the memory cell array 11 based on a current flowing from the bit lines BL1 to BL4 via the memory cells MC into the word lines WL1 to WL4.

In the state determining operation, the line L is applied with a voltage Vread, and the transistor T25 is set to a conductive state. As a result, the global bit line GBLa is charged to, for example, 0.5 V to 1.0 V. In addition, a non-inverting input terminal of the sense amplifier S21 is applied with a reference voltage (for example, 3V). Note that similarly, along with charging of the global bit line GBL, the word lines WL1 to WL4 are also charged to, for example, 3 V (not illustrated in FIG. 9).

Next, a voltage of the word lines WL1 to WL4 is lowered from 3 V to the ground voltage (0 V). In addition, the control circuit turns the select transistors STr1 to STr4 on. Then, the control circuit adjusts a gate voltage of the transistor T24 to pass a current I_load through the transistor T24. Along with passing of this current I_load, a current I_ch which is substantially equal to the current I_load is passed through the transistor T25.

Now, the memory cell MC where the state determining operation is performed is referred to as a selected memory cell MCS. In the example of FIG. 9, the memory cells connected to the plurality of global bit lines GBL are selected memory cells MCS. In the present embodiment, the above-described control results in a forward current being passed through the selected memory cell MCS in the state determining operation. Therefore, a voltage of the node N is determined by the current flowing from the bit lines BL1 to BL4 via the selected memory cells MCS into the word lines WL1 to WL4 (the current flowing in the selected memory cells MCS). A voltage value of the node N is detected by, for example, the sense amplifier S21. If a current I_BL flowing in the bit lines BL1 to BL4 is larger than the current I_ch, then the voltage of the node N decreases.

In addition, the resistance value of the variable resistance element VR sometimes changes according to the cycle number. As a result, the current I_BL sometimes changes according to the cycle number of the variable resistance element VR in the selected memory cell MCS. Therefore, the voltage of the node N may be said to change according to the cycle number of the selected memory cell MCS. The control circuit adjusts the setting voltage or the resetting voltage based on the voltage of the node N detected by such a state determining operation.

[Advantages]

As described above, in the first embodiment, the control circuit detects the voltage of the global bit line GBL that changes based on the current flowing from a plurality of the bit lines BL via a plurality of the variable resistance elements VR into a plurality of the word lines WL, and the control circuit adjusts the setting voltage or the resetting voltage based on the detected voltage. Therefore, the first embodiment can adjust the setting voltage or the resetting voltage according to the change in characteristics of the variable resistance element VR according to the cycle number. Hence, the present embodiment allows the resistance value of the variable resistance element VR to be changed accurately.

In addition, the state determining operation can be performed adopting many of the memory cells MC as selected memory cells MCS. That is, even when there is variation in the cycle number of the respective memory cells MC, the cycle numbers are averaged to perform the state determining operation. As a result, accuracy of the state determining operation can be improved.

Other Examples of First Embodiment

In the above-described first embodiment, the selected-bit-line voltage supply circuits 13a, 13b, . . . were described as executing a similar operation, and thereby executing the state determining operation on the memory cells MC of the entire memory cell array 11. However, it is not required to select all of the memory cells MC as the selected memory cells MCS, and it is also possible to select a portion of the memory cells MC in the memory cell array 11 as the selected memory cells MCS.

Figure 10:
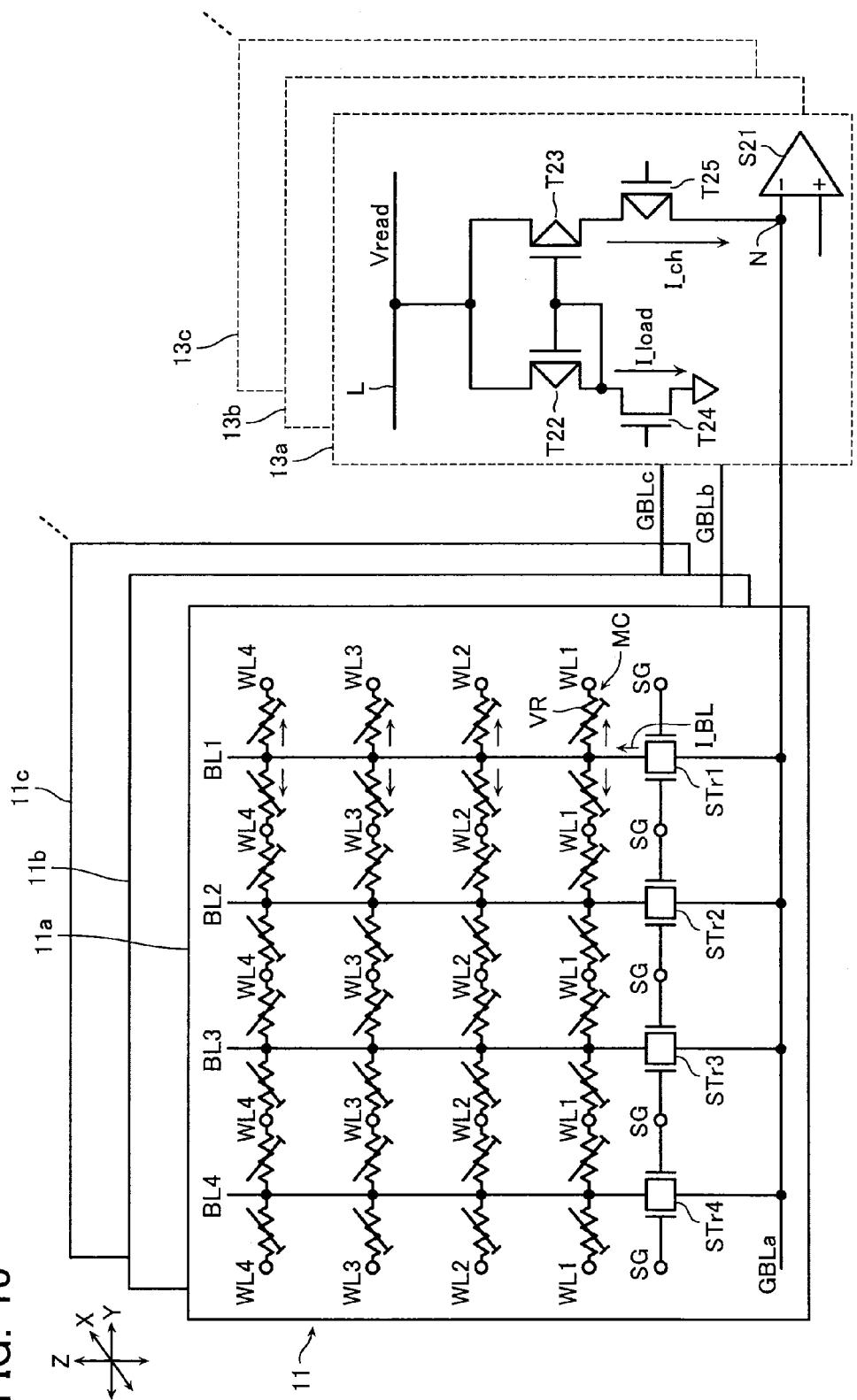
FIG. 10 is another example of a view showing the selected-bit-line voltage supply circuits 13a to 13c according to the first embodiment.

For example, as shown in FIG. 10, in the state determining operation of the selected-bit-line voltage supply circuit 13a according to the first embodiment, it is possible for only the select transistor STr1 to be set to a conductive state and for the select transistors STr2, STr3, and STr4 to be set to a non-conductive state. In this case, the voltage of the node N is determined by a current flowing from only the bit line BL1, via the memory cells MC, into the word lines WL1 to WL4. At this time, in the selected-bit-line voltage supply circuits 13b and 13c too, the voltage of the node N is determined by a current flowing from only the bit line BL1, via the memory cells MC, into the word lines WL1 to WL4.

That is, in the previously-described example, the memory cells connected to all of the bit lines BL (two or more) were adopted as the selected memory cells MCS, but in this example of FIG. 10, only the memory cells MC connected to one bit line BL (selected bit line) are adopted as the selected memory cell MCS. This results in almost no current flowing in the memory cells MC connected to the other bit lines BL. As a result, the number of memory cells applied with an electrical stress can be reduced.

Figure 11A:
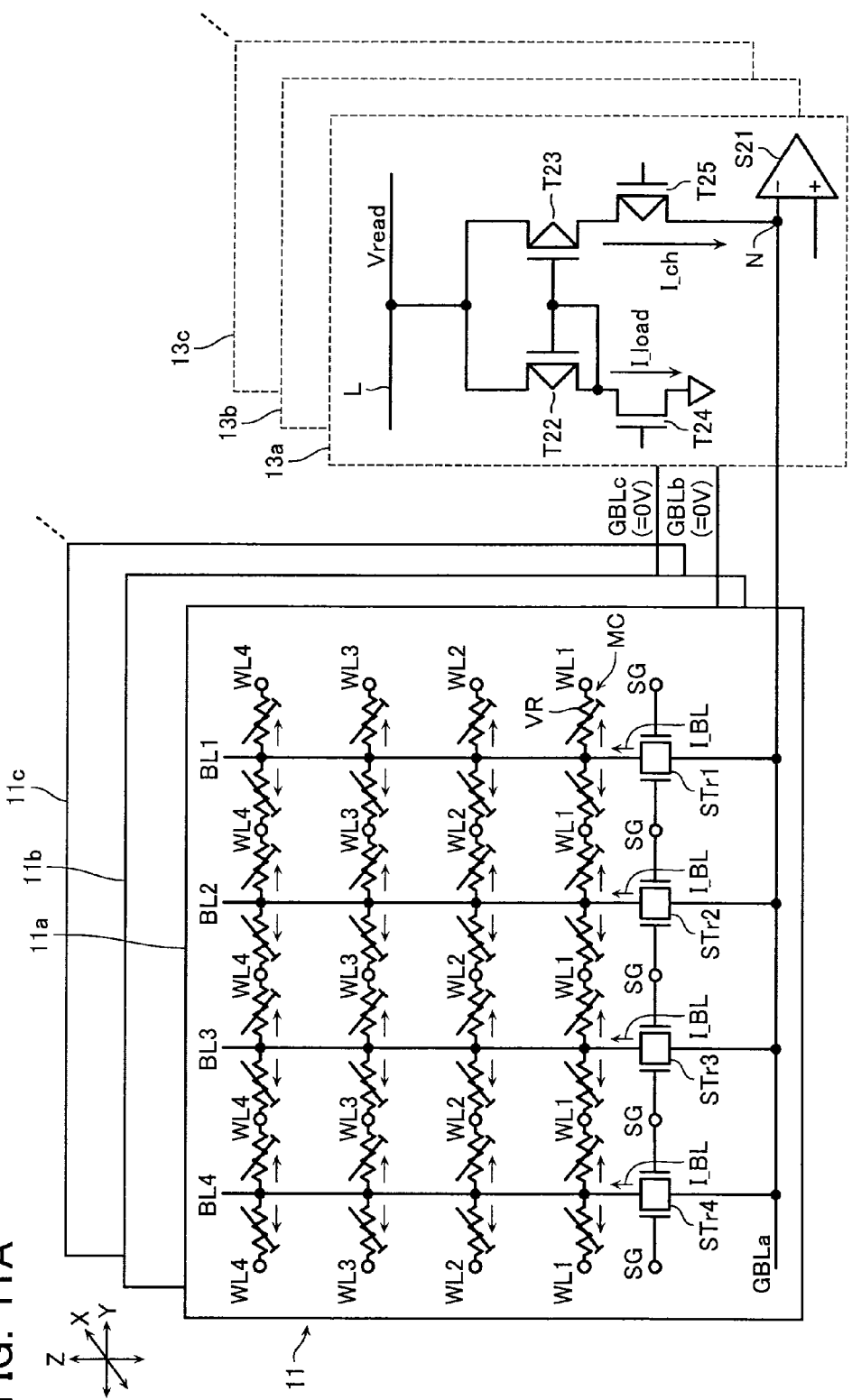
FIG. 11A is another example of a view showing the selected-bit-line voltage supply circuits 13a to 13c according to the first embodiment.

In addition, as shown in FIG. 11A, the state determining operation may be performed employing only the selected-bit-line voltage supply circuit 13a according to the first embodiment. In this case, a voltage is applied to only one global bit line GBLa (selected global bit line GBL), and the voltage of the node N is determined by a current flowing into the word lines WL1 to WL4 via the memory cells MC in the memory cell group 11a. At this time, a voltage is not applied to the global bit lines GBLb and GBLc, and the state determining operation is not executed in the selected-bit-line voltage supply circuits 13b, 13c, . . . .

As a result, cycle numbers can be averaged to perform an accurate state determining operation while reducing the number of memory cells MC applied with an electrical stress.

Figure 11B:
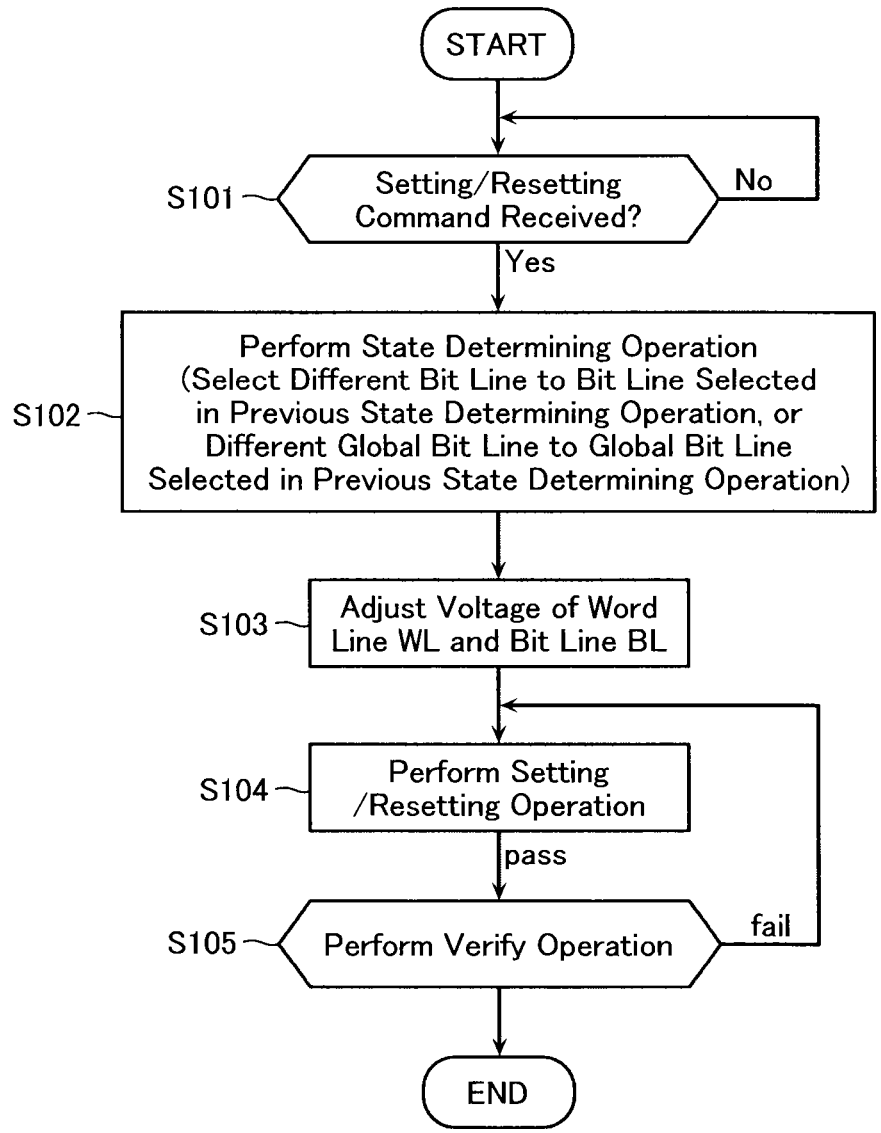
FIG. 11B is an example of a flowchart showing the setting or resetting operation in the case of adopting a configuration of FIG. 11A.

Furthermore, as shown in FIG. 11B, it is also possible to change the selected-bit-line every state determining operation (it is possible to select a different bit line BL to a bit line BL selected in a previous state determining operation) in FIG. 10. Additionally, as shown in FIG. 11B, it is also possible to change the selected global bit line every state determining operation (it is possible to select a different global bit line GBL to a global bit line GBL selected in a previous state determining operation) in FIG. 11A. As a result, electrical stress can be applied uniformly in a plurality of the memory cells MC.

Second Embodiment

Next, a semiconductor memory device according to a second embodiment will be described with reference to FIG. 12. The second embodiment has a similar configuration to the first embodiment, hence in the present embodiment, a description of the configuration will be omitted. In the second embodiment, a timing at which the state determining operation is executed differs from that in the first embodiment. The second embodiment executes the state determining operation when the number of times of accesses (the number of times the setting operation and the resetting operation have been executed) reaches a certain number of times.

Figure 12:
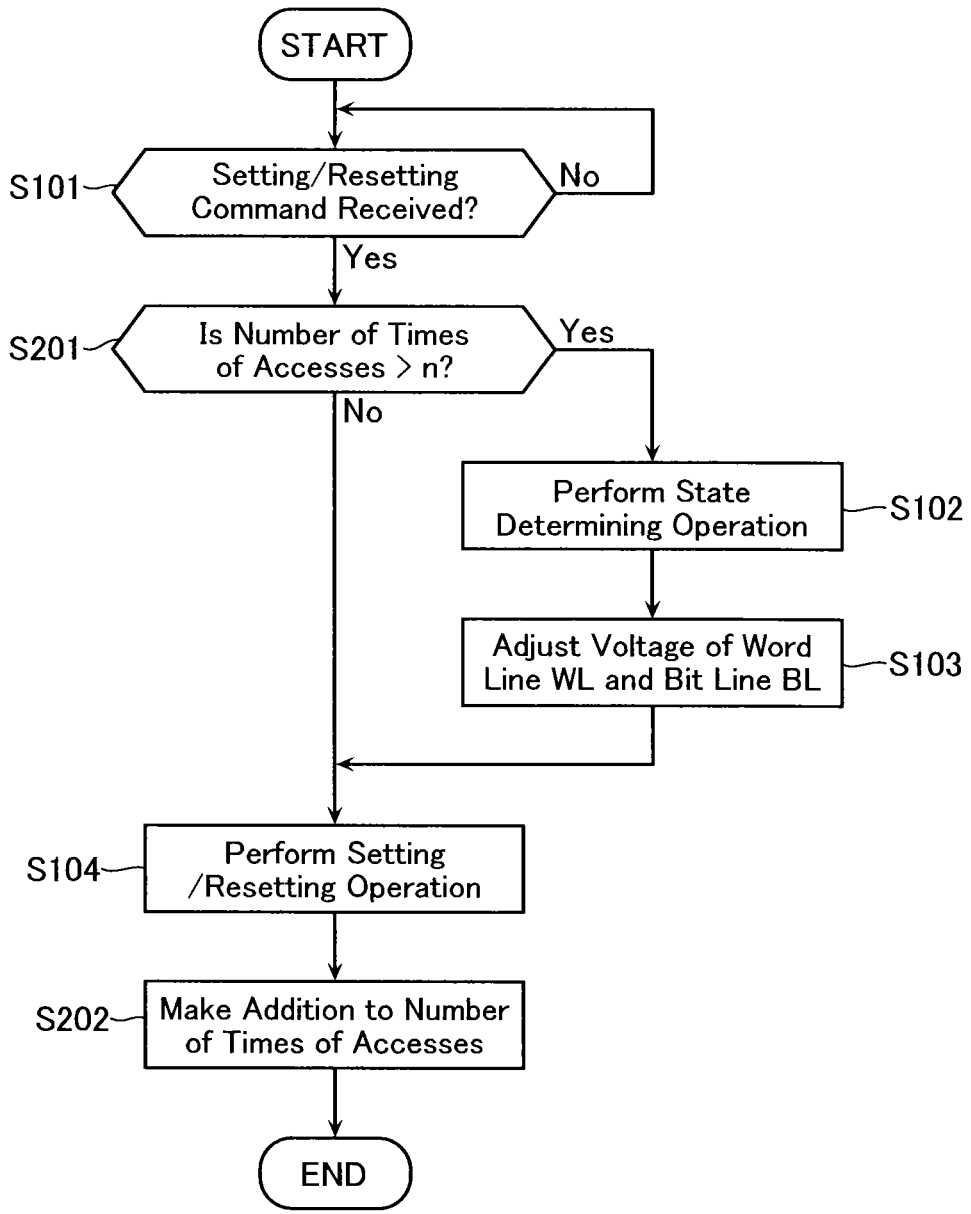
FIG. 12 is an example of a flowchart showing a setting or resetting operation according to a second embodiment.

As shown in FIG. 12, the control circuit determines whether the semiconductor memory device has received a setting or resetting command, or not (S101), similarly to in the first embodiment. Now, if it is determined that the setting or resetting command has been received (S101, Yes), then, as a number-of-times-of-accesses determining operation, the control circuit determines, for example, whether the number of times of accesses to the memory cell array 11 is greater than n, or not (S201). Note that n is a natural number of 2 or more.

If it is determined that the number of times of accesses to the memory cell array 11 is greater than n (S201, Yes), then the control circuit executes steps S102 to S104 similar to those of the first embodiment. Then, the control circuit adds 1 to the number of times of accesses to the memory cell array 11 (S202).

On the other hand, if it is determined that the number of times of accesses to the memory cell array 11 is less than n (S201, No), then the control circuit omits processing of steps S102 and S103, and executes processing of steps S104 and S202.

Now, the number-of-times-of-accesses determining operation may be set to be performed every m×(n−1) times, or may be set to be performed every $m^{(n-1)}$ times. Note that m is a natural number of 2 or more.

As described above, the second embodiment also has advantages similar to those of the first embodiment. Moreover, the present embodiment executes the state determining operation when the number of times of accesses reaches a certain number of times. Hence, the present embodiment allows a time required for the setting or resetting operation to be reduced compared to the first embodiment.

Third Embodiment

Next, a semiconductor memory device according to a third embodiment will be described with reference to FIG. 13. The third embodiment has a similar configuration to the first embodiment, hence in the present embodiment, a description of the configuration will be omitted. In the third embodiment, a timing at which the state determining operation is executed differs from that in the first embodiment. In the third embodiment, the control circuit receives a first setting or resetting command and a second setting or resetting command from the host or memory controller MH. The first setting or resetting command is a command that executes the setting or resetting operation after the state determining operation, similarly to in the first embodiment. The second setting or resetting command is a command that executes the setting or resetting operation without executing the state determining operation.

Figure 13:
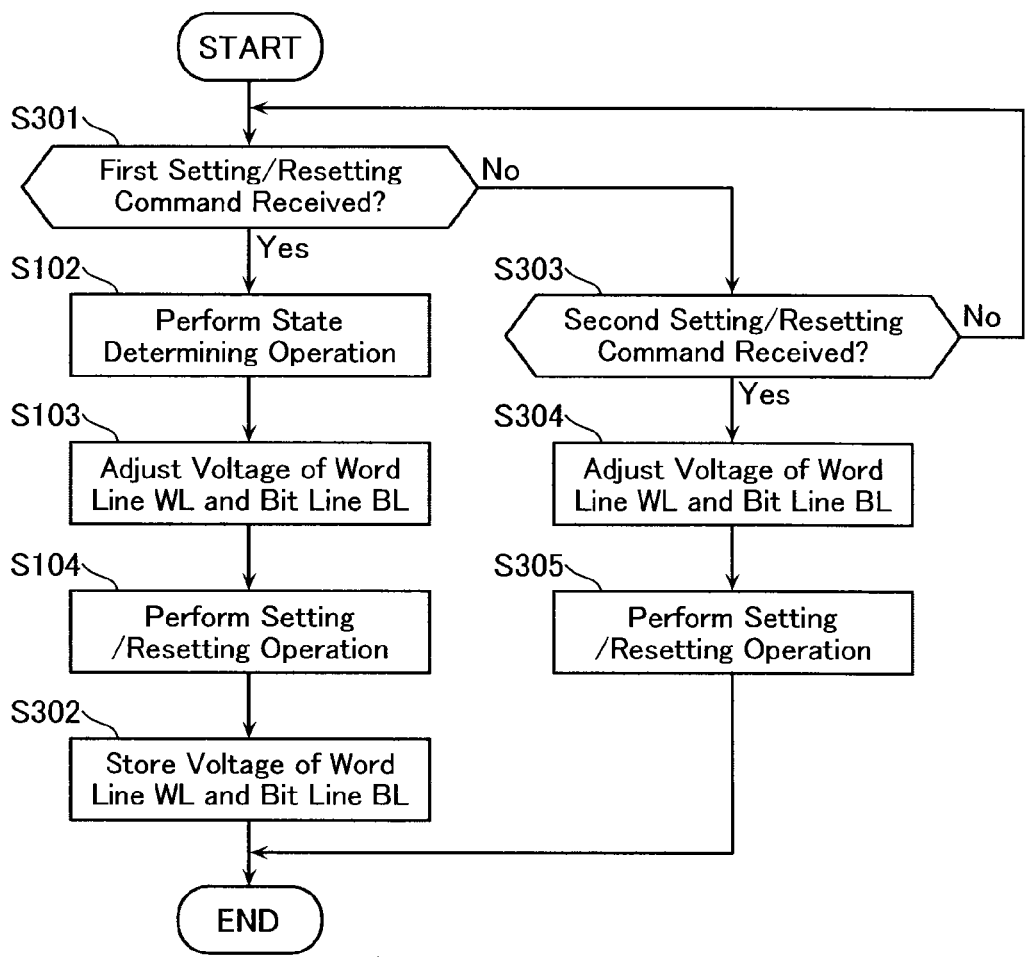
FIG. 13 is an example of a flowchart showing a setting or resetting operation according to a third embodiment.

As shown in FIG. 13, in the third embodiment, it is determined whether the control circuit has received the first setting or resetting command from the host or memory controller MH, or not (S301). Now, if it is determined that the first setting or resetting command has been received (S301, Yes), then the control circuit executes steps S102 to S104 similar to those of the first embodiment. Then, the control circuit stores the voltage of the word line WL and the bit line BL in the setting or resetting operation, in a ROM fuse, or the like (S302).

On the other hand, if it is determined that the first setting or resetting command has not been received (S301, No), then the control circuit determines whether the second setting or resetting command has been received, or not (S303). Now, if it is determined that the second setting or resetting command has been received (S303, Yes), then the control circuit adjusts the voltage of the word line WL and the bit line BL based on the voltage stored in the above-described step S302 (S304), and executes the setting or resetting operation (S305).

Now, in the case where the second setting or resetting command is received before the first setting or resetting command is received, the voltage of the word line WL and the bit line BL is not stored. In this case, the setting or resetting operation may be performed without adjusting the voltage of the word line WL and the bit line BL.

As described above, the present embodiment responds to the first setting or resetting command to execute the state determining operation and store the voltage applied to the word line WL and the bit line BL during the resetting operation or the setting operation. Moreover, the present embodiment responds to the second setting or resetting command to adjust the voltage applied to the word line WL and the bit line BL during the resetting operation or the setting operation, based on the stored voltage. Hence, the third embodiment also has advantages similar to those of the first embodiment. Moreover, the third embodiment allows a time required for the setting or resetting operation to be reduced compared to the first embodiment.

Other

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising a memory cell array and a control circuit, the memory cell array including:

first lines and second lines intersecting each other;

a third line commonly connecting to the first lines;

memory cells disposed at intersections of the first lines and the second lines, respectively, each of the memory cells including a variable resistance element; and selection elements disposed between the first lines and the third line, the control circuit being configured to execute a state determining operation detecting a voltage of the third line, and adjust a voltage applied to the first lines and the second lines during a resetting operation or a setting operation based on a result of the state determining operation, the resetting operation raising a resistance value of the variable resistance element, and the setting operation lowering the resistance value of the variable resistance element.

2. The semiconductor memory device according to claim 1, wherein
the selection elements are select transistors having its one end connected to one end of the first line and having its other end connected to the third line,
and the semiconductor memory device further comprises a select gate line connected to gates of the select transistors.

3. The semiconductor memory device according to claim 1, wherein
the state determining operation selects one of the first lines to detect the voltage of the third line.

4. The semiconductor memory device according to claim 1, wherein
the state determining operation selects two or more of the first lines to detect the voltage of the third line.

5. The semiconductor memory device according to claim 1, wherein
the control circuit is configured to execute the state determining operation, the resetting operation, or the setting operation in response to a first command.

6. The semiconductor memory device according to claim 1, wherein
the control circuit is configured to execute the state determining operation when the number of times the resetting operation or the setting operation have been executed reaches a first number of times.

7. The semiconductor memory device according to claim 1, wherein
the control circuit is configured to execute the state determining operation in response to a second command, and store as first information the voltage applied to the first lines and the second lines during the resetting operation or the setting operation, and
the control circuit is configured to, in response to a third command, adjust the voltage applied to the first lines and the second lines during the resetting operation or the setting operation, based on the first information.

8. The semiconductor memory device according to claim 1, wherein
the control circuit is configured to, when executing the setting operation or the resetting operation, set the number of variable resistance elements in a low-resistance state in the memory cell array to be substantially equal to the number of variable resistance elements in a high-resistance state in the memory cell array.

9. The semiconductor memory device according to claim 1, wherein
the control circuit, in the state determining operation, raises a voltage of the first lines and a voltage of the second lines to a first voltage, and then lowers the voltage of the second lines to a second voltage.

10. The semiconductor memory device according to claim 1, wherein
the control circuit comprises:
a sense amplifier operative to compare a voltage of the first line and a reference voltage; and
a current mirror circuit connected to an input terminal of the sense amplifier.

11. The semiconductor memory device according to claim 1, wherein
two or more of the third lines are disposed, and
the state determining operation detects a voltage of the third lines.

12. The semiconductor memory device according to claim 7, wherein
the third command instructs adjusting the voltage applied to the first lines and the second lines, without performing the state determining operation.

13. A memory system, comprising:
a semiconductor memory device; and
a controller,
the semiconductor memory device comprising a memory cell array and a control circuit,
the memory cell array including:
first lines and second lines intersecting each other;
a third line commonly connecting to the first lines;
memory cells disposed at intersections of the first lines and the second lines, respectively, each of the memory cells including a variable resistance element; and
selection elements disposed between the first lines and the third line,
the control circuit being configured to execute a state determining operation detecting a voltage of the third line, and adjust a voltage applied to the first lines and the second lines during a resetting operation or a setting operation based on a result of the state determining operation,
the resetting operation raising a resistance value of the variable resistance element, and
the setting operation lowering the resistance value of the variable resistance element.

14. The memory system according to claim 13, wherein
the controller sends a first command to the semiconductor memory device, and
the semiconductor memory device is configured to execute the state determining operation, the resetting operation, or the setting operation in response to the first command.

15. The memory system according to claim 13, wherein
the controller sends a second command and a third command to the semiconductor memory device,
the semiconductor memory device is configured to, when it has received the second command, execute the state determining operation, and store as first information the voltage applied to the first lines and the second lines during the resetting operation or the setting operation, and
the semiconductor memory device is configured to, when it has received the third command, adjust the voltage applied to the first lines and the second lines during the resetting operation or the setting operation, based on the first information.

16. The memory system according to claim 15, wherein
the semiconductor memory device, when it has received the third command, adjusts the voltage applied to the first lines and the second lines, without performing the state determining operation.

* * * * *